US008770141B2

(12) United States Patent
Ikagawa et al.

(10) Patent No.: US 8,770,141 B2
(45) Date of Patent: Jul. 8, 2014

(54) SUBSTRATE COATING DEVICE WITH CONTROL SECTION THAT SYNCHRONIZES SUBSTRATE MOVING VELOCITY AND DELIVERY PUMP

(75) Inventors: Yoshinori Ikagawa, Okayama (JP); Mitsunori Oda, Okayama (JP); Minoru Yamamoto, Okayama (JP); Takashi Kawaguchi, Okayama (JP); Hideo Hirata, Okayama (JP); Masaaki Tanabe, Okayama (JP)

(73) Assignee: Tazmo Co., Ltd., Okayama (JP)

(*) Notice: Subject to any disclaimer, the term of this patent is extended or adjusted under 35 U.S.C. 154(b) by 94 days.

(21) Appl. No.: 13/377,606

(22) PCT Filed: Apr. 19, 2010

(86) PCT No.: PCT/JP2010/056928
§ 371 (c)(1), (2), (4) Date: Dec. 12, 2011

(87) PCT Pub. No.: WO2010/146928
PCT Pub. Date: Dec. 23, 2010

(65) Prior Publication Data

US 2012/0085282 A1 Apr. 12, 2012

(30) Foreign Application Priority Data

Jun. 19, 2009 (JP) ................................ 2009-146778

(51) Int. Cl.
*B05C 11/00* (2006.01)
*C23C 16/52* (2006.01)
*B05D 1/02* (2006.01)

(52) U.S. Cl.
USPC ........... 118/686; 118/683; 118/682; 427/424; 427/8

(58) Field of Classification Search
USPC ......... 118/674, 680, 683, 684, 686, 688, 713, 118/DIG. 2
See application file for complete search history.

(56) References Cited

U.S. PATENT DOCUMENTS 4,829,793 A * 5/1989 Holder et al. ............... 68/205 R
4,858,172 A * 8/1989 Stern .............................. 700/40

(Continued)

FOREIGN PATENT DOCUMENTS

JP 62-289266 12/1987
JP H07-029809 1/1995

(Continued)

OTHER PUBLICATIONS

International Search Report for corresponding International Application No. PCT/JP2010/056928 mailed Jun. 29, 2010.

*Primary Examiner* — Dah-Wei D Yuan
*Assistant Examiner* — Karl Kurple
(74) *Attorney, Agent, or Firm* — Renner, Otto, Boisselle & Sklar, LLP

(57) ABSTRACT

A substrate coating device is provided which is capable of reducing non-uniform film thickness areas that take place in a coating start portion and a coating end portion during coating using a slit nozzle coater.

The substrate coating device (10) includes at least a slider driving motor (4), a pump (8), a delivery state quantity measuring section (82), and a control section (5). The slider driving motor (4) scans a slit nozzle (1) over a substrate (100) at an established velocity relative to the substrate (100). The pump (8) controls the supply of the coating liquid to the slit nozzle (1). The delivery state quantity measuring section (82) is configured to measure a state quantity indicative of a delivery state of the coating liquid from the tip of the slit nozzle (1). The control section (5) corrects control information to be fed to the slider driving motor (4) in such a manner as to cancel out a difference between control information fed to the pump (8) and measurement information fed from the delivery state quantity measuring section (82) based on difference information indicative of the difference.

5 Claims, 8 Drawing Sheets

(56) References Cited

U.S. PATENT DOCUMENTS

| | | | | | |
|---|---|---|---|---|---|
| 5,319,568 | A * | 6/1994 | Bezaire | 700/123 |
| 5,380,366 | A * | 1/1995 | Becker et al. | 118/712 |
| RE35,010 | E * | 8/1995 | Price | 222/1 |
| 5,687,092 | A * | 11/1997 | Bretmersky et al. | 702/100 |
| 6,517,891 | B1 * | 2/2003 | Estelle et al. | 427/8 |
| 6,630,028 | B2 * | 10/2003 | Briese et al. | 118/683 |
| 6,746,712 | B2 * | 6/2004 | Hoffmann et al. | 427/208.6 |
| 6,942,736 | B2 * | 9/2005 | Chinander et al. | 118/692 |
| 7,018,476 | B2 * | 3/2006 | Kistler et al. | 118/667 |
| 7,208,721 | B2 * | 4/2007 | Valentin et al. | 250/221 |
| 7,717,059 | B2 * | 5/2010 | Wanthal et al. | 118/669 |
| 2003/0101931 | A1 * | 6/2003 | Estelle et al. | 118/300 |
| 2005/0048196 | A1 * | 3/2005 | Yanagita et al. | 427/8 |
| 2006/0263513 | A1 * | 11/2006 | Romanin | 427/8 |

FOREIGN PATENT DOCUMENTS

| | | | |
|---|---|---|---|
| JP | 2000-005682 | | 1/2000 |
| JP | 2002-239445 | | 8/2002 |
| JP | 2002-361146 | | 12/2002 |
| JP | 2003-190862 | | 7/2003 |
| JP | 2004-148229 | | 5/2004 |
| JP | 2005-095757 | | 4/2005 |
| JP | 2005-305426 | | 11/2005 |
| JP | 2005-329305 | | 12/2005 |
| JP | 2007-330935 | | 12/2007 |
| JP | 2008-062207 | | 3/2008 |
| JP | 2008-140895 | | 6/2008 |
| KR | 10-2007-0077089 | A | 7/2007 |
| KR | 10-0821063 | B | 4/2008 |
| TW | 200740582 | A | 11/2007 |

* cited by examiner

FIG.8

| COATING VELOCITY Vs | COATING FILM CONDITION | |
|---|---|---|
| | CONVENTIONAL ART | PRESENT INVENTION |
| 50mm/sec | ○ | ○ |
| 100mm/sec | ○ | ○ |
| 200mm/sec | △ | ○ |
| 250mm/sec | × | ○ |

○: GOOD, △: PARTIAL COATING BREAK OBSERVED , ×: COATING IMPOSSIBLE

SUBSTRATE COATING DEVICE WITH CONTROL SECTION THAT SYNCHRONIZES SUBSTRATE MOVING VELOCITY AND DELIVERY PUMP

TECHNICAL FIELD

The present invention relates to a substrate coating device for coating a to-be-coated surface of a plate-shaped substrate, such as a glass substrate, with a coating liquid, such as a resist liquid, by scanning a nozzle over the substrate in one direction relative to the substrate while delivering the coating liquid from the nozzle.

BACKGROUND ART

In coating a surface of a plate-shaped substrate, such as a glass substrate, with a coating liquid, use is made of a substrate coating device configured to scan a slit-shaped nozzle relative to the surface of the substrate in a predetermined scanning direction perpendicular to the slit with a spacing kept between the nozzle and the surface of the substrate.

In order to coat the surface of the substrate with a desired thickness of the coating liquid uniformly, the coating liquid needs to form a proper bead shape between the tip of the nozzle and the surface of the substrate. It is also important to reduce the dimensions of non-uniform film thickness areas which take place in a coating start portion and a coating end portion as much as possible.

Conventional substrate coating devices include, for example, a substrate coating device of the type which is configured to reduce the non-uniform film thickness area that takes place in the coating start portion by controlling the delivery rate of the coating liquid required to form a bead at the start of coating as well as the substrate wait time (see Patent Literature 1 for example). This substrate coating device can reduce the non-uniform film thickness area that takes place at the end of coating end by stopping the pump at the time when the nozzle becomes positioned short of reaching the position at which the pump is usually stopped or controlling the total volume of the coating liquid supplied from the pump to the nozzle.

CITATION LIST

Patent Literature

Patent Literature 1: Japanese Patent Laid-Open Publication No. 2005-305426

SUMMARY OF INVENTION

Technical Problem

One of the factors which cause the film thickness to become non-uniform in the coating start portion and the coating end portion is a difference that occurs between a content of control performed on the pump and an actual operation of the pump. For this reason, even when the content of control performed on the pump is contrived as in the technique according to Patent Literature 1 mentioned above, it is still difficult to eliminate the film thickness non-uniformity in the coating start portion and the coating end portion as long as the difference exits between the content of control performed on the pump and the actual operation of the pump.

Another factor causing the film thickness to become non-uniform in the coating start portion and the coating end portion is a lack of proper balance between the supply (inclusive of the pressure and the flow rate) of the coating liquid from the slit nozzle and the relative movement of the substrate. When the supply (inclusive of the pressure and the flow rate) of the coating liquid from the slit nozzle is not properly balanced with the relative movement of the substrate, adverse effects might result on controls of other units. Examples of such adverse effects include a difficulty in determining optimum timing to actuate a pressure reducing mechanism.

An object of the present invention is to provide a substrate coating device which is capable of reducing non-uniform film thickness areas that take place in the coating start portion and the coating end portion during coating using a slit nozzle coater.

Solution to Problem

A substrate coating device according to the present invention is configured to coat a to-be-coated surface of a plate-shaped substrate with a coating liquid by scanning a slit nozzle over the substrate in one direction relative to the substrate while delivering the coating liquid from the slit nozzle. The substrate coating device includes at least a scanning section, a supply control section, a delivery state quantity measuring section, and a control section.

The scanning section is configured to scan the slit nozzle over the substrate at an established velocity relative to the substrate. The supply control section is configured to control a supply of the coating liquid to the slit nozzle. The delivery state quantity measuring section is configured to measure a state quantity indicative of a delivery state of the coating liquid from a tip of the nozzle.

The control section is configured to control the scanning section and the supply control section based on measurement information from the delivery state quantity measuring section. The control section corrects control information to be fed to the scanning section so as to cancel out a difference between control information fed to the supply control section and the measurement information fed from the delivery state measuring section based on difference information indicative of the difference.

Advantageous Effects of Invention

The present invention makes it possible to reduce non-uniform film thickness areas that take place in a coating start portion and a coating end portion during coating using a slit nozzle coater.

BRIEF DESCRIPTION OF DRAWINGS

FIG. 8 is a table illustrating a coating velocity improving effect of the present invention.

DESCRIPTION OF EMBODIMENTS

Figure 1:
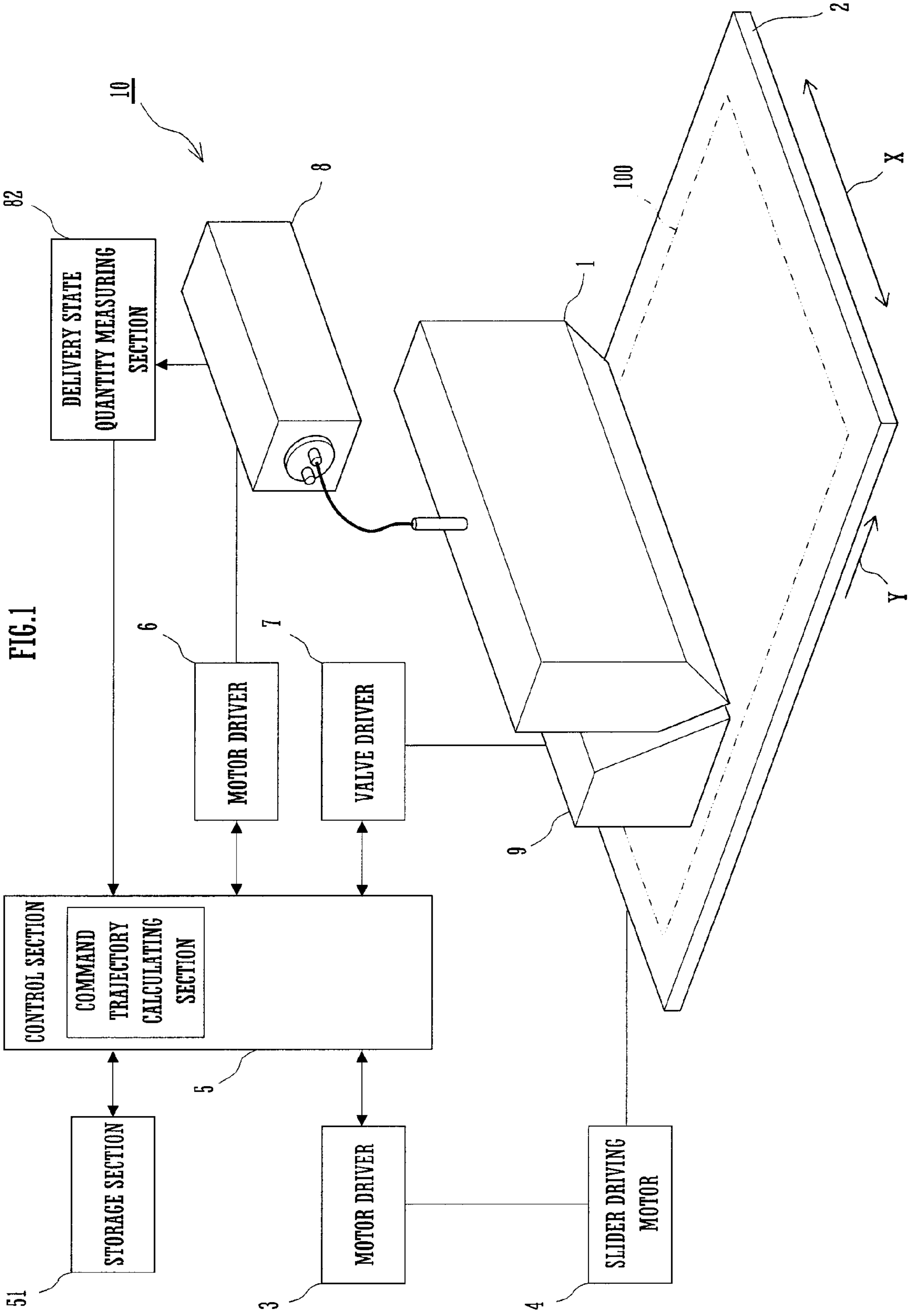
FIG. 1 is a schematic view illustrating the configuration of a substrate coating device according to an embodiment of the present invention.

Referring to FIG. 1, a substrate coating device 10 according to an embodiment of the present invention includes a slit nozzle 1, a slider 2, a motor driver 3, a slider driving motor 4, a motor driver 6, a pump 8, a delivery state quantity measuring section 82, a pressure control chamber 9, a valve driver 7, and a control section 5.

The slit nozzle 1 delivers a coating liquid from a slit which is defined in a bottom surface so as to extend in a direction indicated by arrow X. The slider 2 has a top surface designed to support a plate-shaped substrate 100. During a coating process, the slider 2 is moved in a direction indicated by arrow Y by the slider driving motor 4 driven by the motor driver 3.

The pump 8 supplies the coating liquid stored in a non-illustrated tank into a chamber provided in the slit nozzle 1 by revolution of a motor (not shown) driven by the motor driver 6. In the slit nozzle 1, the coating liquid is fed to the nozzle after having been charged into the chamber. The rate of delivery of the coating liquid from the slit nozzle 1 is controlled by the supply of the coating liquid from the pump 8. The pump 8 is a metering pump of the plunger or syringe type which can control the delivery rate of the coating liquid accurately.

The delivery state quantity measuring section 82 is configured to measure a state quantity (examples of which include a delivery pressure and a delivery flow rate) indicative of a delivery state of the coating liquid from the tip of the slit nozzle 1. In measuring the delivery state of the slit nozzle 1, it is preferable to measure either the pressure inside the piping or the nozzle by means of a pressure gauge or the flow rate inside the piping or the nozzle by means of a flowmeter. In the present embodiment, the delivery state quantity measuring section 82 comprises a pressure gauge which is capable of measuring the delivery pressure of the coating liquid and a flowmeter which is capable of measuring the delivery flow rate of the coating liquid. However, the delivery state quantity measuring section 82 may comprise only one of the pressure gauge and the flowmeter.

The pressure control chamber 9 is disposed adjacent the slit nozzle 1 on the opposite side from the slit nozzle 1 in the arrow Y direction. The pressure control chamber 9 is configured to control the air pressure between the slit nozzle 1 and the surface of the substrate 100. The pressure control chamber 9 controls the air pressure between the slit nozzle 1 and the surface of the substrate 100 by means of a pressurizing valve and a pressure reducing valve.

The control section 5 is connected to the motor driver 3, motor driver 6, valve driver 7, delivery state quantity measuring section 82, and storage section 51 and is configured to control the operations of these components overall. The control section 5 stores therein data fed from the delivery state quantity measuring section 82 and prepares command trajectory data by computation of the data stored. The control section 5 controls the motor driver 3, motor driver 6 and valve driver 7 based on the command trajectory data thus prepared. The motor driver 3 drives the slider driving motor 4 at an electric power according to the command trajectory data. The motor driver 6 drives the motor of the pump 8 at an electric power according to the command trajectory data. The valve driver 7 opens and closes the pressurizing valve or pressure reducing valve of the pressure control chamber 9 in accordance with the command trajectory data.

Figure 2:
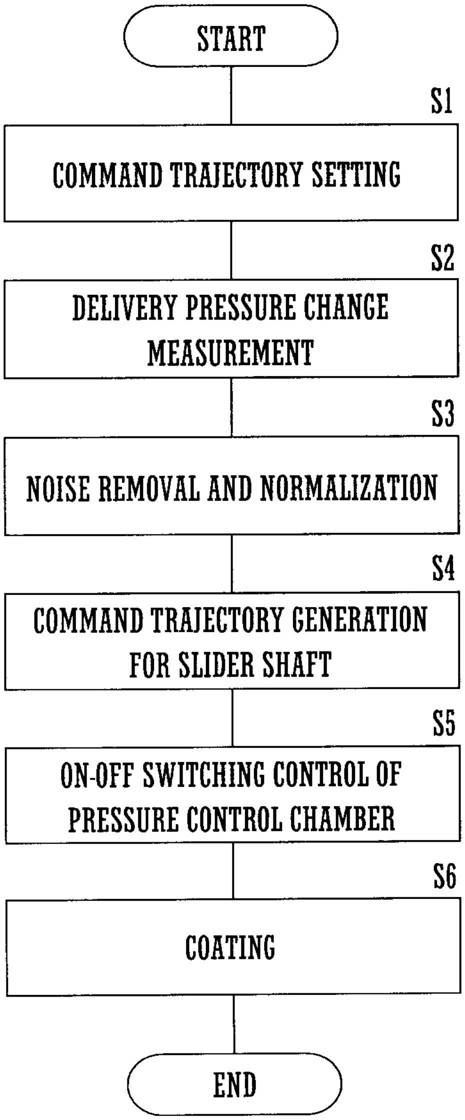
FIG. 2 is a flowchart of a process carried out by a control section of the substrate coating device.

Referring to FIG. 2, description is made of an exemplary control process carried out by the control section 5 in a coating process. In the coating process, three operations are performed including a bead forming operation, a coat forming operation, and a liquid drain-off operation. The substrate coating device 10 is configured to control the pressure around the tip of the slit nozzle 1 by means of the pressure control chamber 9 and synchronize that pressure control with the control over the pump 8 and the slider driving motor 4, thereby optimizing the bead forming operation and the liquid drain-off operation. The control process carried out by the control section 5 is specifically described below.

Figure 3A:
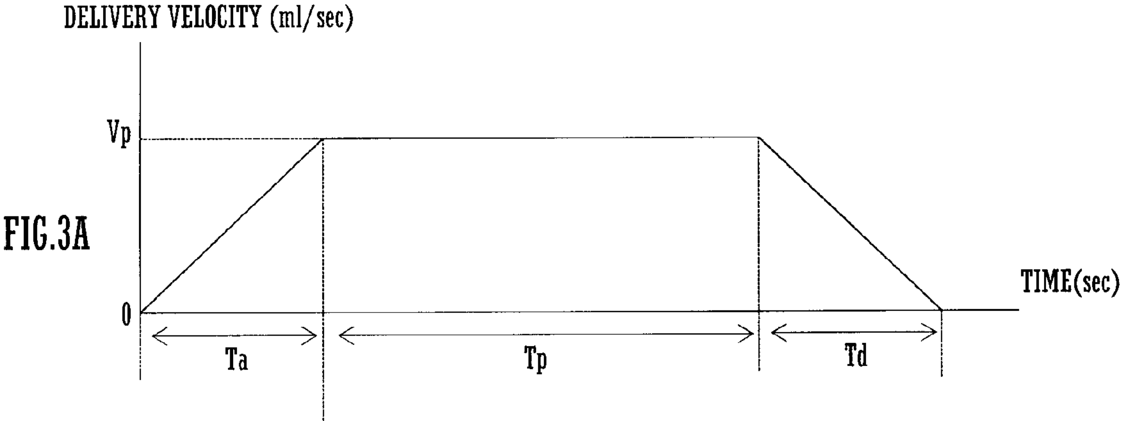
FIGS. 3A and 3B are diagrams illustrating exemplary state changes in delivery rate and delivery pressure with elapse of time.

Initially, the control section 5 performs a command trajectory setting step (step S1). In step S1, the control section 5 determines a maximum delivery velocity Vp, an accelerating interval Ta, a decelerating interval Td and a constant delivery interval Tp as coating operation conditions for the pump 8 and sets a command trajectory for controlling the pump shaft (i.e., motor) as shown in FIG. 3A. Because the constant delivery interval Tp is determined from the outcome of a command trajectory generating step S5 for the slider shaft, a provisional default value is used as the constant delivery interval Tp determined here.

Subsequently, the control section 5 proceeds to a delivery pressure change measuring step (step S2). In this step, the pump 8 is actuated actually by using the command trajectory obtained by the command trajectory setting step S1, while delivery pressure changes that take place during the actual operation of the pump 8 are measured as shown in FIG. 3B.

Figure 3B:
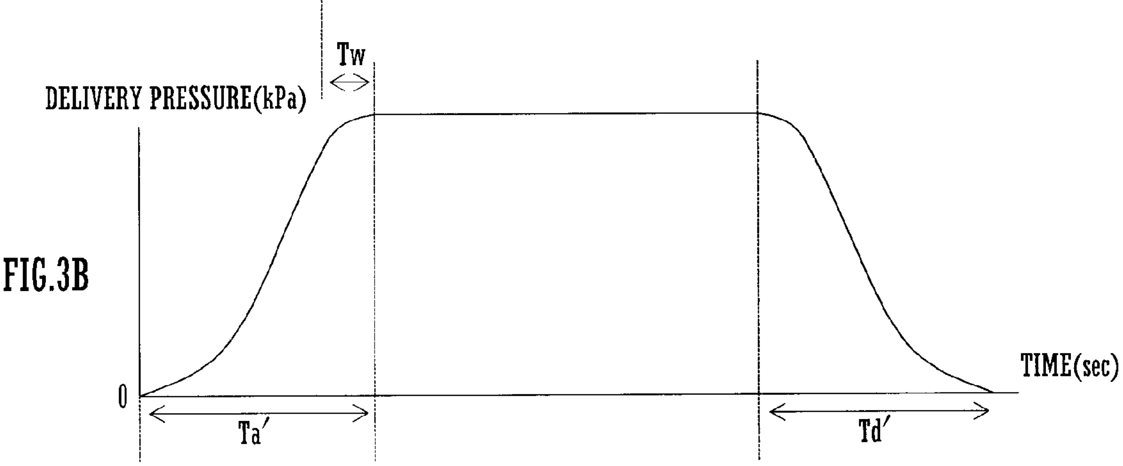

In FIG. 3, arrow Tw represents a time loss that occurs due to the resistance of chemical piping. As shown in FIG. 3B, nonlinear responses that are attributable to the delivery mechanism of the pump occur in an accelerating interval Ta' and a decelerating interval Td'.

Figure 4A:
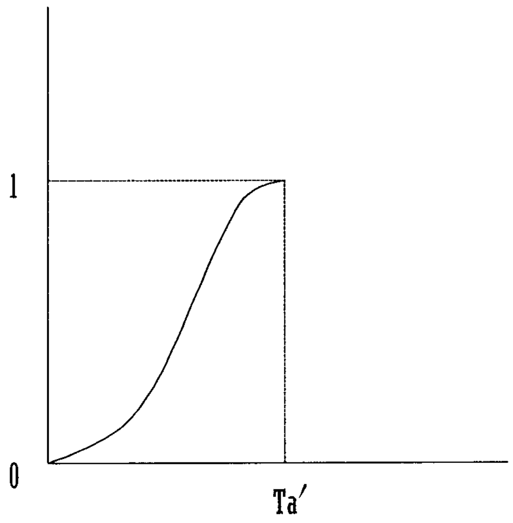
FIGS. 4A and 4B are diagrams illustrating normalization of time-pressure data in an accelerating interval and in a decelerating interval.
Figure 4B:
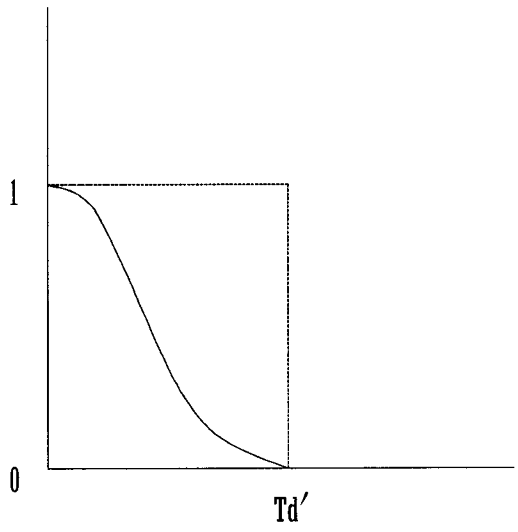

Subsequently, the control section 5 performs noise removal from and normalization of the delivery pressure in the accelerating interval Ta' and the decelerating interval Td' (step S3). In step S3, the noise removal and the normalization are performed by extracting time-pressure data from the accelerating interval Ta' in which the delivery pressure rises up to a predetermined constant pressure and from the decelerating interval Td' in which the delivery pressure lowers to zero in response to a command to start decelerating, as shown in FIGS. 4A and 4B.

Here, brief description is made of the noise removal and the normalization. The “noise removal” performed in step S3 is a process for removing noise components from the delivery pressure change data obtained by measurement. In the present embodiment, specifically, after pressure changes had been measured using a sampling frequency of 1 kHz, noise components of the measurement data thus obtained were removed by using a low-pass filter at 100 Hz. The low-pass filter may be based on a digital processing technique for numerically processing the measured data or an analog processing technique for processing the measured data by using a suitable electrical circuit connected between measuring terminals. Alternatively, the noise removal may be performed in such a manner that singular points and discontinuous changes contained in the data are removed by a method of smoothing the resulting pressure change curve by the use of spline interpolation.

With respect to the “normalization” performed in step S3, the “absolute value” of the measured delivery pressure data may vary depending on the performance of the delivery pump used and the physical properties of the coating liquid. However, the “absolute value” is not important information in the command trajectory generation in step S4 and in the subsequent steps. It is essential only that information on a delivery pressure change with time (during a period from the time at which the delivery starts to the time at which the constant delivery velocity is reached) be obtained. For this reason, in order to generalize the computation procedure in step S4 and the subsequent steps by neglecting the absolute value information on the delivery pressure, the unit of the delivery pressure change data is preferably converted in advance so that the data falls within a numerical range from 0 to 1. The present embodiment employs this technique (see the scales of the ordinate axes in FIGS. 4A and 4B).

Figure 5A:
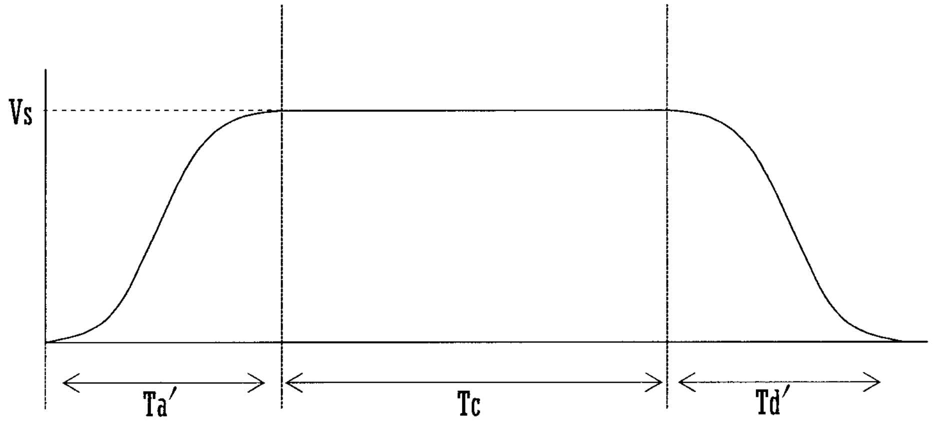
FIGS. 5A and 5B are diagrams illustrating exemplary trajectories obtained by a command trajectory generating step.
Figure 5B:
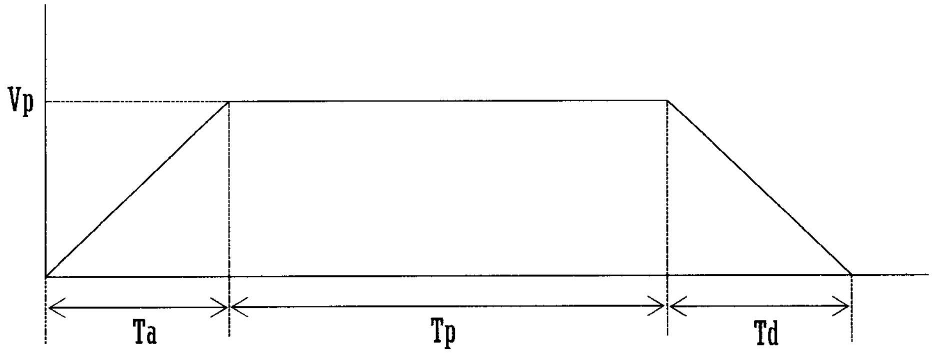
Figure 6:
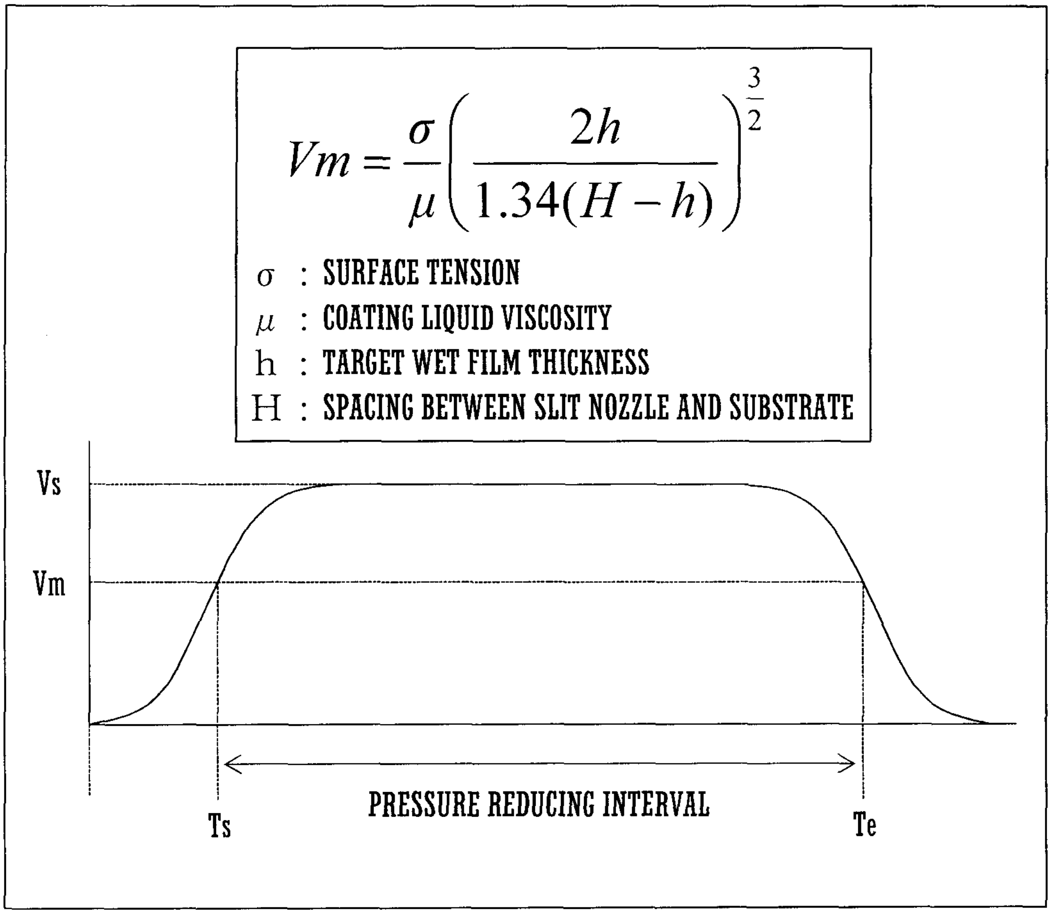
FIG. 6 is an explanatory diagram illustrating a limit velocity which forms a basis for ON-OFF control of a pressure control chamber.

Subsequently, the control section 5 proceeds to the step of generating a command trajectory for the slider shaft (step S4). In step S4, the control section 5 determines a maximum moving velocity Vs, applies the normalized curve to a slider shaft accelerating segment and a slider shaft decelerating segment, and adjusts a constant moving velocity interval Tc so as to obtain a predetermined coating length, as shown in FIG. 5A. Further, the control section 5 determines the constant delivery interval Tp for the pump shaft so that the constant delivery interval Tp synchronizes with the command trajectory for the slider shaft.

In general, the slider 2 (i.e., the mechanism for relatively moving the substrate) has higher responsiveness to a control than the pump 8 and, hence, driving shaft correction is preferably made with respect to the slider driving motor 4 which moves the slider 2.

Subsequently, the control section 5 proceeds to the step of controlling ON-OFF switching of the pressure reducing valve of the pressure control chamber 9 (step S5). In step S5, the control section 5 determines an interval in which the command velocity of the slider (i.e., the scanning velocity of the slider 2 obtained after correction) becomes equal to or higher than the "limit velocity Vm" given by the following expression in the command slider velocity trajectory obtained by the command trajectory generating step for the slider shaft. The control section 5 performs ON-OFF switching control of the pressure reducing valve at start time Ts and end time Te of the interval thus determined.

$$Vm = \frac{\sigma}{\mu}\left(\frac{2h}{1.34(H-h)}\right)^{\frac{3}{2}} \qquad \text{[Expression 1]}$$

In the above expression, σ represents a surface tension, μ represents a coating liquid viscosity, h represents a target wet film thickness, and H represents a spacing between the slit nozzle 1 and the substrate 100.

The expression for calculating the limit velocity mentioned above is generally known as "Higgins' coating bound expression". The expression is used to determine conditions which enable slit nozzle coating for obtaining a predetermined thickness to be realized with an ideal bead being formed (see B. G. Higgings et al., Chem. Eng. Sci., 35, 673-682 (1980) for example).

In using the pressure reducing mechanism, preferably, ON-OFF switching control of the pressure reducing valve of the pressure control chamber 9 is properly performed based on the above-described limit velocity. This is because it is possible that the bead formation is adversely affected if the pressure reducing mechanism is actuated under a condition in which the velocity of the slider is low enough to fall short of the limit velocity.

Thereafter, the control section 5 carries out the coating process on the substrate 100 by controlling the motor driver 3, motor driver 6 and valve driver 7 while referencing the contents of the command trajectory for each shaft set in step S4 and the contents of the ON-OFF switching control of the pressure reducing valve performed in step S5 (step S6).

The above-described steps S1 to S6 make it possible to obtain correct information on the difference between a command output signal to the motor used to drive the delivery pump and a change in coating liquid delivery from the tip of the slit nozzle 1 by measuring a change in coating pressure or coating flow rate with time (step S2). By correcting the command for the driving shaft so as to cancel off the difference information, non-uniform film thickness areas which take place at the start and end of coating can be reduced significantly (step S4).

It has conventionally been difficult to ascertain stable coating conditions (e.g., whether or not to form a bead) based on the coating theory because of the nonlinear response property of the delivery pump, namely, the property that the delivery mechanism fails to linearly respond to a command to the driving motor. By contrast, the use of the arrangement according to the present invention makes it possible to grasp the delivery state from a motor command signal accurately. As a result, it becomes possible to determine a marginal condition (i.e., condition for the slider 2 to move at a velocity of not less than a threshold value) according to the coating theory and realize high-speed coating by actuating the pressure reducing mechanism with proper timing.

Preferably, the step of analyzing the film thickness uniformity in the coating start portion and the coating end portion is added to the above-described steps S1 to S6. If the film thickness uniformity in the coating start portion and the coating end portion is not satisfactory enough, the control conditions are simply optimized by repeating the above-described steps S1 to S6.

Figure 7A:
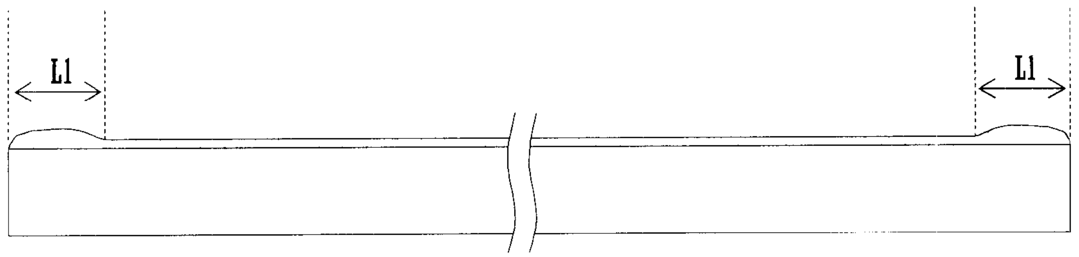
FIGS. 7A and 7B are views illustrating a non-uniform area reducing effect of the present invention.
Figure 7B:
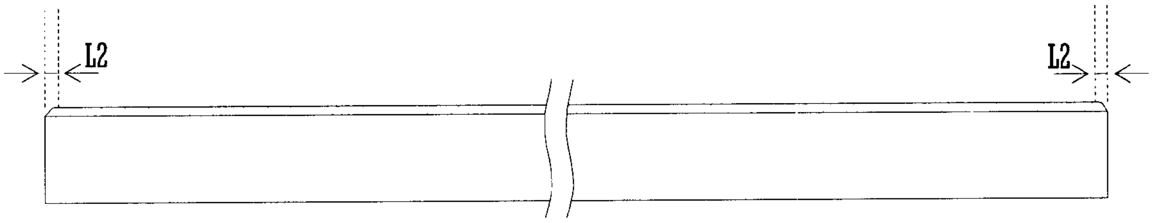

The above-described steps S1 to S6 make it possible to optimize the formation of bead and the drain-off of the coating liquid. As a result, a non-uniform area of the coating film according to the present embodiment as shown in FIG. 7B has a length L2 which is remarkably reduced as compared to a length L1 of a non-uniform area of a conventional coating film as shown in FIG. 7A. Specifically, as compared to the length L1 of the non-uniform area of the conventional coating film which measures about 30 mm, the length L2 of the non-uniform area of the coating film according to the present embodiment is reduced to 5 mm and, therefore, the non-uniform film thickness areas in the coating start portion and the coating end portion are reduced by a factor of about 6.

The substrate coating device 10 is capable of performing coating at a higher velocity than the conventional art, as shown in FIG. 8. The conventional art allows a partial coating break to occur at a coating velocity Vs of about 200 mm/sec or more and becomes incapable of performing proper coating when the coating velocity Vs reaches 250 mm/sec. By contract, the substrate coating device 10 is capable of performing satisfactory coating even when the coating velocity reaches 250 mm/sec.

The liquid retaining state at the tip of the nozzle can be rendered better by optimum liquid drain-off. This enables a stable bead to be formed at the time of subsequent bead formation. In performing intermittent coating (i.e., pattern coating), it is possible to eliminate priming which has been conventionally needed in the intervals between coating operations. By optimizing the liquid drain-off, it is possible to form stable beads successively.

The foregoing embodiments should be construed to be illustrative and not limitative of the present invention in all the points. The scope of the present invention is defined by the following claims, not by the foregoing embodiments. Further, the scope of the present invention is intended to include the scopes of the claims and all possible changes and modifications within the senses and scopes of equivalents.

| Reference Signs List | |
|---|---|
| 1 | slit nozzle |
| 2 | slider |
| 3 | motor driver |
| 4 | slider driving motor |
| 5 | control section |
| 6 | motor driver |
| 7 | valve driver |
| 8 | pump |
| 9 | pressure control chamber |
| 10 | substrate coating device |
| 82 | delivery state quantity measuring section |
| 100 | substrate |

The invention claimed is:

1. A substrate coating device for forming a coating film of a fixed length on a surface of a plate-shaped substrate by scanning a slit nozzle over the substrate in one direction relative to the substrate while delivering a coating liquid from the slit nozzle, the substrate coating device comprising:

a slider for supporting the substrate and configured to be driven by a slider shaft actuated according to a generated command trajectory for driving the slider including an accelerating interval (Ta'), a constant moving velocity interval (Tc), and a decelerating interval (Td') of the slider and scan the slit nozzle relative to the substrate;

a pump configured to be driven by a pump shaft actuated according to a command trajectory of coating operating conditions including an accelerating interval (Ta), a constant delivery interval (Tp), and a decelerating interval (Td) of said pump shaft and the pump supplies the coating liquid to the slit nozzle;

a delivery state quantity measuring section configured to measure a state quantity indicative of a delivery state of the coating liquid from a tip of the slit nozzle; and a control section configured to control the slider and the pump by generating the command trajectories of the slider shaft and the pump shaft, wherein the generated command trajectory of the slider shaft based on measurement information received from the delivery state quantity measuring section when the pump is driven according to the command trajectory of the pump shaft.

2. The substrate coating device according to claim 1, wherein the delivery state quantity measuring section includes at least one of a pressure gauge which is configured to measure a delivery pressure of the coating liquid and a flowmeter which is configured to measure a delivery flow rate of the coating liquid.

3. The substrate coating device according to claim 2, further comprising a pressure reducing section configured to alter a coating bead shape by reducing a pressure between the slit nozzle and the substrate, wherein the control section controls an operation of the pressure reducing section based on generated command trajectory of the slider shaft.

4. The substrate coating device according to claim 3, wherein the control section actuates the pressure reducing section when wherein the control section actuates the pressure reducing section when a velocity Vs of the slider shaft based on the generated command trajectory becomes equal to or higher than a limit velocity Vm given by the following expression:

$$Vm = \frac{\sigma}{\mu}\left(\frac{2h}{1.34(H-h)}\right)^{\frac{3}{2}}$$

wherein σ represents a surface tension, μ represents a coating liquid viscosity, h represents a target wet film thickness, and H represents a spacing between the slit nozzle and the substrate.

5. The substrate coating device according to claim 1, wherein the control section determines the constant delivery interval (Tp) in the command trajectory for the pump shaft so that the constant delivery interval (Tp) synchronizes with the generated command trajectory for the slider shaft.

* * * * *